(12) United States Patent  
Chen (10) Patent No.: US 10,510,389 B2  
(45) Date of Patent: Dec. 17, 2019

(54) WORD LINE DECODER CIRCUIT

(71) Applicant: Winbond Electronics Corp., Taichung (TW)

(72) Inventor: Chung-Zen Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/954,617

(22) Filed: Apr. 17, 2018

(65) Prior Publication Data

US 2018/0358063 A1 Dec. 13, 2018

(30) Foreign Application Priority Data

Jun. 9, 2017 (CN) .......................... 2017 1 0430917

(51) Int. Cl.
| | |
|---|---|
| *G11C 8/08* | (2006.01) |
| *G11C 8/10* | (2006.01) |
| *G11C 7/22* | (2006.01) |
| *G11C 5/14* | (2006.01) |

(52) U.S. Cl.
CPC ................ *G11C 8/10* (2013.01); *G11C 5/145* (2013.01); *G11C 5/147* (2013.01); *G11C 7/22* (2013.01); *G11C 8/08* (2013.01)

(58) Field of Classification Search
CPC ........... G11C 8/00; G11C 5/145; G11C 5/147; G11C 7/22
USPC ................................................... 365/189.15
See application file for complete search history.

(56) References Cited

U.S. PATENT DOCUMENTS

| | | | |
|---|---|---|---|
| 5,761,135 A | 6/1998 | Lee | |
| 6,014,328 A | 1/2000 | Onakado et al. | |
| 6,452,441 B1 | 9/2002 | Kim et al. | |
| 7,145,830 B2* | 12/2006 | Takahashi | G11C 11/406 |
| | | | 365/227 |
| 8,154,927 B2* | 4/2012 | Lee | G11C 16/28 |
| | | | 365/185.02 |
| 2005/0207214 A1* | 9/2005 | Takahashi | G11C 11/406 |
| | | | 365/154 |
| 2011/0075484 A1* | 3/2011 | Lee | G11C 16/0408 |
| | | | 365/185.17 |
| 2016/0225438 A1 | 8/2016 | Kulkarni et al. | |

FOREIGN PATENT DOCUMENTS

| | | |
|---|---|---|
| CN | 101707437 | 5/2010 |
| TW | 559812 | 11/2003 |
| TW | I229491 | 3/2005 |

OTHER PUBLICATIONS

"Office Action of Taiwan Counterpart Application", dated Apr. 23, 2018, p1-p7.

* cited by examiner

*Primary Examiner* — Xiaochun L Chen (74) *Attorney, Agent, or Firm* — JCIPRNET (57) ABSTRACT

A word line decoder circuit located in a memory storage apparatus is provided. The memory storage apparatus includes a memory cell array. The word line decoder circuit includes a word line decoder and a power supply circuit. The word line decoder is coupled to a plurality of word lines of the memory storage apparatus. The power supply circuit is coupled to the word line decoder. The power supply circuit is configured to provide a first power to the word line decoder in a read mode, and provide a second power to the word line decoder in a standby mode. A voltage value of the first power is greater than or less than that of the second power.

14 Claims, 8 Drawing Sheets

WORD LINE DECODER CIRCUIT

CROSS-REFERENCE TO RELATED APPLICATION

This application claims the priority benefit of Chinese application serial no. 201710430917.9, filed on Jun. 9, 2017. The entirety of the above-mentioned patent application is hereby incorporated by reference herein and made a part of this specification.

BACKGROUND OF THE INVENTION

1. Field of the Invention

The invention relates to a decoder circuit, and more particularly, relates to a word line decoder circuit.

2. Description of Related Art

In general, a memory storage apparatus is usually provided with three operating modes, including a read mode, a standby mode and a deep power down mode. The memory storage apparatus in the deep power down mode requires one command to wake up for dynamic operations. Therefore, the current consumed by the memory storage apparatus is very low in the deep power down mode. Although the memory storage apparatus in the deep power down mode have the advantage described above, it often takes a lot of time to wake up the memory storage apparatus by using the command.

Apart from that, in the prior art, the power of the memory storage apparatus in the standby mode is usually a high voltage (HV). The presence of this high voltage will lead to a larger leak current of the memory storage apparatus, thereby increasing the consumed current.

SUMMARY OF THE INVENTION

The invention is directed to a word line decoder circuit, which is capable of reducing its consumed current in the standby mode.

A word line decoder circuit of the invention is located in a memory storage apparatus, and the memory storage apparatus includes a memory cell array. The word line decoder circuit includes a word line decoder and a power supply circuit. The word line decoder is coupled to a plurality of word lines of the memory storage apparatus. The power supply circuit is coupled to the word line decoder. The power supply circuit is configured to provide a first power to the word line decoder in a read mode, and provide a second power to the word line decoder in a standby mode. A voltage value of the first power is greater than or less than a voltage value of the second power.

In an embodiment of the invention, the power supply circuit is further configured to provide a third power to the word line decoder in the read mode. A voltage value of the third power is greater than or less than the voltage value of the second power.

In an embodiment of the invention, the voltage value of the first power is equal to the voltage value of the third power.

In an embodiment of the invention, the read mode includes a first read period and a second read period. The word line decoder receives the first power in the first read period. The word line decoder receives the third power in the second read period.

In an embodiment of the invention, a first bank in the memory cell array is read in the first read period. A second read period in the memory cell array is read in the second read period.

In an embodiment of the invention, the first bank and the second bank are a same bank in the memory cell array.

In an embodiment of the invention, the first bank and the second bank are different banks in the memory cell array.

In an embodiment of the invention, the word line decoder includes a plurality of sub-decoders. Each of the sub-decoders is coupled to a plurality of corresponding word lines among the word lines.

In an embodiment of the invention, the power supply circuit includes a plurality of power supplies. Each of the power supplies is coupled to corresponding one of the sub-decoders. Each of the power supplies is configured to provide the first power or the third power to the coupled sub-decoder in the read mode, and provide the second power to the coupled sub-decoder in the standby mode.

In an embodiment of the invention, the power supply circuit is coupled to a first charge pump circuit. The first charge pump circuit is configured to provide the first power and boost the voltage value of the first power when the first power is lower than a first reference voltage.

In an embodiment of the invention, the power supply circuit is coupled to a second charge pump circuit. The second charge pump circuit is configured to provide the third power and boost the voltage value of the third power when the third power is lower than a second reference voltage.

In an embodiment of the invention, the word line decoder further includes a pre-decoder. The pre-decoder is coupled to the power supply circuit. The pre-decoder is configured to select a bank in the memory cell array for a read operation.

In an embodiment of the invention, the second power is one selected from a first voltage, a second voltage and a third voltage.

In an embodiment of the present invention, the first voltage is greater than the second voltage. The second voltage is greater than the third voltage.

Based on the above, according to the exemplary embodiments of the invention, the power supply circuit provides the first power to the word line decoder in the read mode, and provides the second power to the word line decoder in the standby mode. As a result, the word line decoder circuit can reduce its consumed current in the standby mode.

To make the above features and advantages of the disclosure more comprehensible, several embodiments accompanied with drawings are described in detail as follows.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Embodiments are provided below to describe the invention in detail, though the invention is not limited to the provided embodiments, and the provided embodiments can be suitably combined. The term "coupling/coupled" used in this specification (including claims) may refer to any direct or indirect connection means. For example, "a first device is coupled to a second device" should be interpreted as "the first device is directly connected to the second device" or "the first device is indirectly connected to the second device through other devices or connection means." In addition, the term "signal" can refer to a current, a voltage, a charge, a temperature, data, electromagnetic wave or any one or multiple signals.

Figure 1:
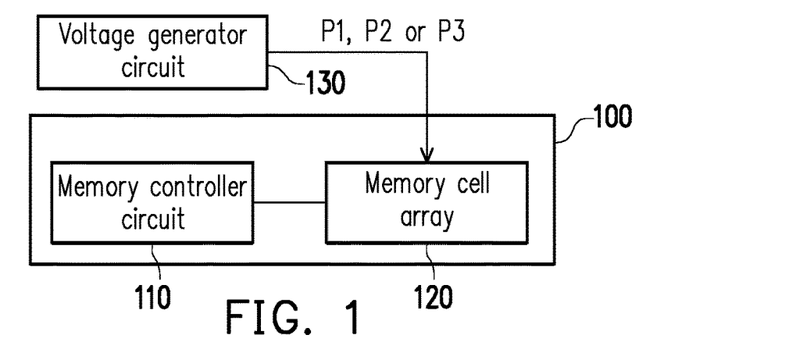
FIG. 1 illustrates a schematic diagram of a memory storage apparatus according to an embodiment of the invention.
Figure 2:
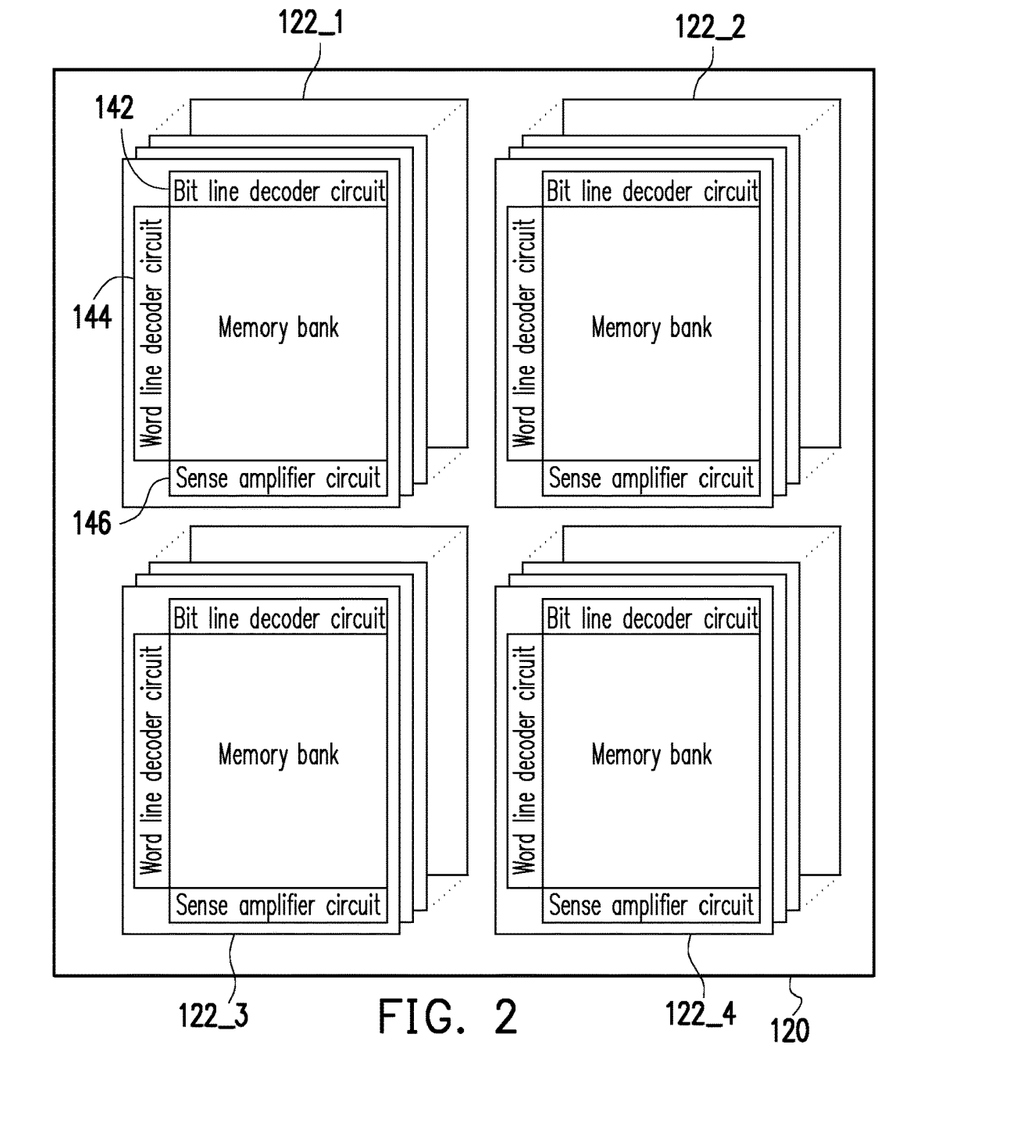
FIG. 2 illustrates a schematic diagram of a memory cell array in the embodiment of FIG. 1.

FIG. 1 illustrates a schematic diagram of a memory storage apparatus according to an embodiment of the invention. FIG. 2 illustrates a schematic diagram of a memory cell array in the embodiment of FIG. 1. With reference to FIG. 1 and FIG. 2, a memory storage apparatus 100 includes a memory controller circuit 110 and a memory cell array 120. In the present embodiment, the memory controller circuit 110 is configured to control the memory storage apparatus 100 to operate in one of multiple operating modes. The operating modes of the present embodiment include, for example, a read mode and a standby mode. In the present embodiment, a voltage generator circuit 130 provides a first power P1, a second power P2 or a third power P3 to the memory storage apparatus 100 in the different operating modes. The memory cell array 120 is electrically connected to the memory controller circuit 110. The memory cell array 120 is configured to store data. In the present embodiment, the memory cell array 120 includes, for example, four memory banks 122_1 to 122_4. However, such amount is merely an example, and the invention is not limited thereto. Each memory bank has a corresponding bit line decoder circuit 142, a word line decoder circuit 144 and a sense amplifier circuit 146 for cooperating with the memory controller circuit 110 in order to complete a data access operation.

In the present embodiment, circuit schemes for each the circuit functional block in the memory controller circuit 110, the memory cell array 120 and the voltage generator circuit 130 may be implemented by any suitable circuits in related art, which are not particularly limited by the invention. Enough teaching, suggestion, and implementation illustration for aforesaid steps and embodiments thereof may be obtained with reference to common knowledge in the related art, which is not repeated hereinafter.

Figure 3:
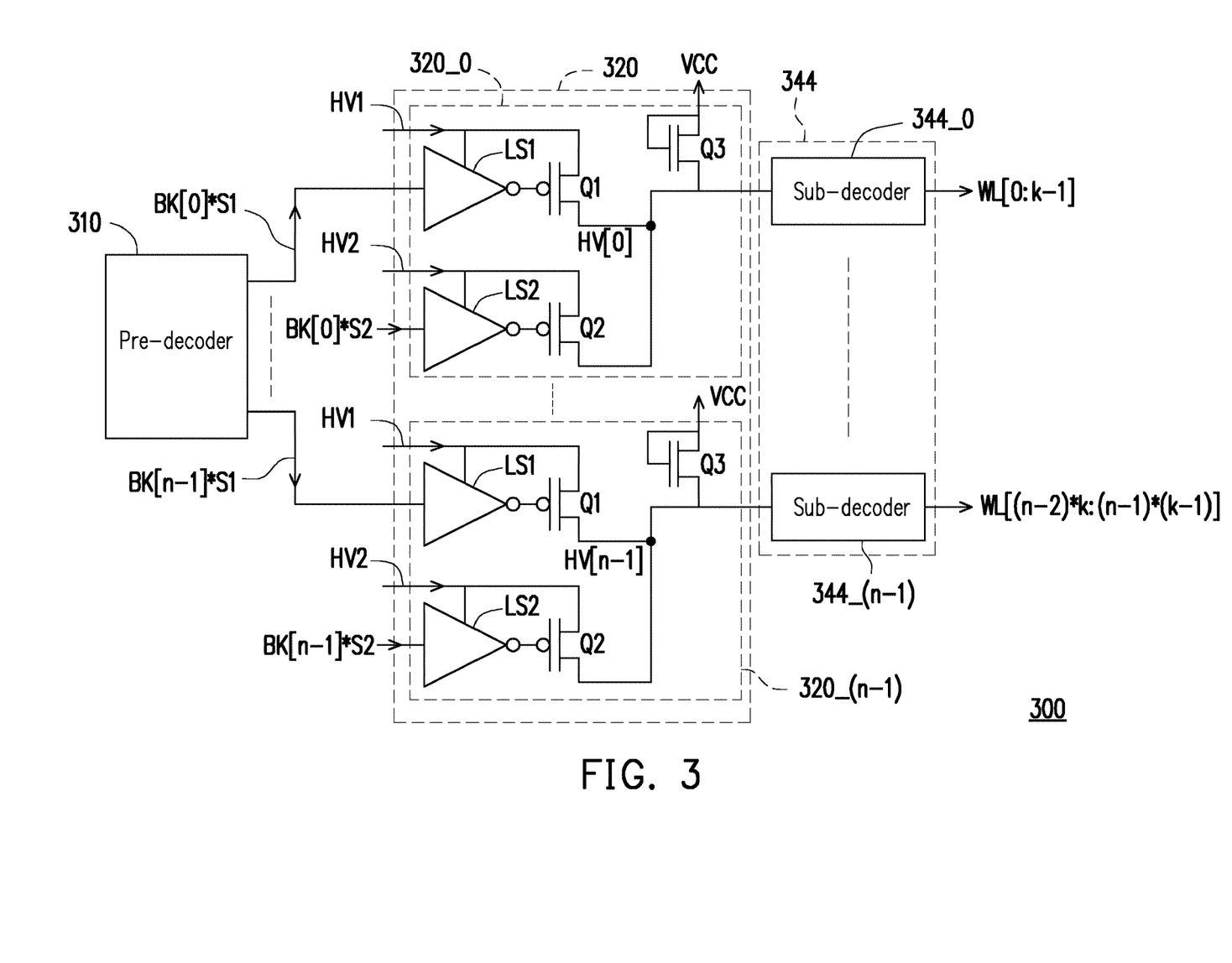
FIG. 3 illustrates a schematic diagram of a word line decoder according to an embodiment of the invention.

FIG. 3 illustrates a schematic diagram of a word line decoder according to an embodiment of the invention. With reference to FIG. 3, a word line decoder 300 of the present embodiment includes a power supply circuit 320 and a word line decoder 344. The power supply circuit 320 has an input terminal coupled to a pre-decoder 310 and an output terminal coupled to the word line decoder 344. The word line decoder 344 has an input terminal coupled to the power supply circuit 320 and an output terminal coupled to a plurality of word lines (not illustrated) of the memory storage apparatus 100.

Specifically, in the present embodiment, the power supply circuit 310 receives a bank address signal, and decodes the bank address signal in order to output bank addresses BK[0] to BK[n−1] to the power supply circuit 320, wherein n is a positive integer greater than 2. In a read period, one or more target banks in the memory cell array 120 will be selected and read. In the present embodiment, the power supply circuit 320 includes a plurality of power supplies 320_0 to 320_(n−1), and the word line decoder 344 includes a plurality of sub-decoders 344_0 to 344_(n−1). In the present embodiment, the word lines of the memory storage apparatus 100 are divided into groups per k lines, and each group of the word lines is coupled to one corresponding sub-decoder among the sub-decoders 344_0 to 344_(n−1), wherein k is a positive integer greater than 1. As such, in the present embodiment, word line addresses WL[0:k−1] outputted by the sub-decoder 344_0 correspond to, for example, addresses of first to $k^{th}$ word lines, and word line addresses WL[(n−2)*k:(n−1)*(k−1)] outputted by the sub-decoder 344_(n−1) correspond to, for example, addresses of $((n-2)*k)^{th}$ to $((n-1)*(k-1))^{th}$ word lines, wherein "*" is the product sign.

In the present embodiment, the power supply circuit 320 provides a first power HV1 or a third power HV2 to the word line decoder 344 in a read mode, and provides a second power to the word line decoder 344 in a standby mode. For instance, in the present embodiment, it is assumed that the target bank corresponding to the bank address BK[0] is to be read. Accordingly, in the read mode, the first power HV1 or the third power HV2 received by the power supply 320_0 is provided to the sub-decoder 344_0 via transistor switches Q1 or Q2. In this example, a voltage at a node HV[0] is equal to the first power HV1 or the third power HV2 in the read period. In the present embodiment, in the standby mode, the transistor switches Q1 and Q2 are not turned on and the transistor switch Q3 is turned on. Accordingly, the second power provided to the sub-decoder 344_0 via the transistor switch Q3 has a voltage being, for example, VCC-Vt, wherein VCC is a voltage value of a bias voltage VCC and Vt is a threshold voltage value of the transistor switch Q3. In the present embodiment, voltage values of the first power HV1 and the third power HV2 may be equal or unequal. In the present embodiment, the voltage value of the first power HV1 is less than the voltage value VCC-Vt of the second power, and the voltage value of the third power HV2 is less than the voltage value VCC-Vt of the second power.

In addition, an operating method for the other power supplies in the power supply circuit 320 may refer to description for the power supply 320_0, which is not repeated hereinafter. Therefore, in the present embodiment, each of the power supplies is configured to provide the first power or the third power to the coupled sub-decoder in the read mode, and provide the second power to the coupled sub-decoder in the standby mode. In the present embodiment, description is provided with the example in which the power supply circuit 320 provides one of the two powers to the word line decoder 344 in the read mode, but the invention is not limited thereto. In an embodiment, it is also possible that only one power (e.g., the first power or the third power) is provided to the word line decoder in the read mode or one of more than two powers is selected and provided to the word line decoder in the read mode, and the invention is not limited to the above.

Figure 4:
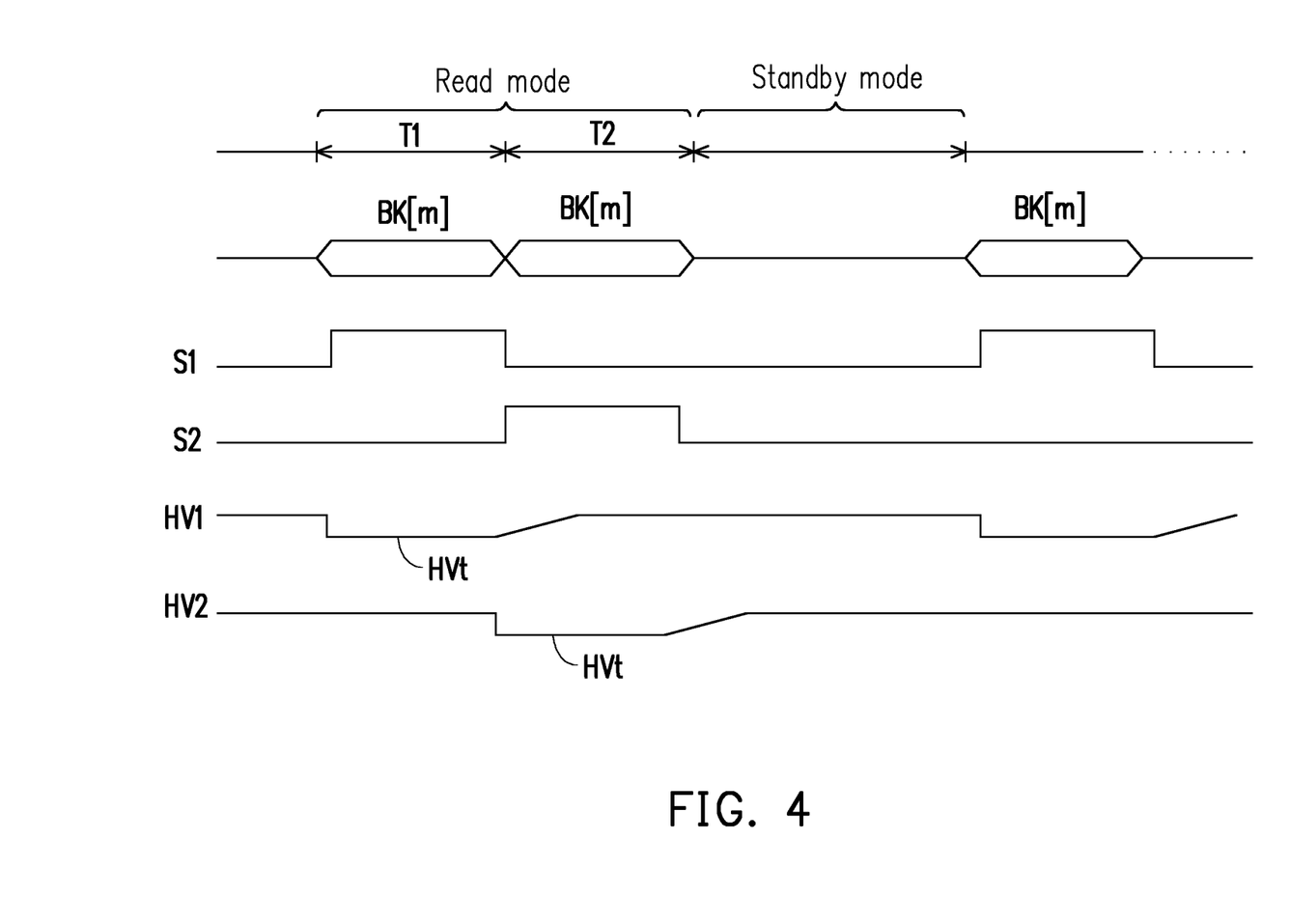
FIG. 4 illustrates a schematic diagram of signal waveforms in the embodiment of FIG. 3.

FIG. 4 illustrates a schematic diagram of signal waveforms in the embodiment of FIG. 3. With reference to FIG. 3 and FIG. 4, in the present embodiment, the read mode includes a first read period T1 and a second read period T2. A memory bank corresponding to a bank address BK[m] is read in the first read period T1, and the memory bank corresponding to the bank address BK[m] is read in the second read period T2, wherein in is an integer greater than or equal to 0. In other words, in the read mode of the present embodiment, the same bank in the memory cell array is read. For instance, with reference to FIG. 3, given that m=0 so the bank address BK[m] is BK[0], which means that in the read mode of the present embodiment, the memory bank corresponding to the bank address BK[0] is read in the first read period T1 as well as in the second read period T2.

In the present embodiment, in the first read period T1, a first select signal S1 is at high level, and a control signal BK[0]*S1 turns on the transistor switch Q1 after passing through a level shifter LS1. Meanwhile, a second select signal S2 is at low level, and the transistor switch Q2 is not turned on. Accordingly, in the first read period T1, the first power HV1 is transmitted to the node HV[0] and provided to the sub-decoder 344_0. In the first read period T1, a voltage level of the first power HV1 is at a target voltage HVt required in a read operation. In the present embodiment, in the second read period T2, the second select signal S1 is at high level, and a control signal BK[0]*S2 turns on the transistor switch Q2 after passing through a level shifter LS2. Meanwhile, the first select signal S1 is at low level, and the transistor switch Q1 is not turned on. Accordingly, in the second read period T2, the third power HV2 is transmitted to the node HV[0] and provided to the sub-decoder 344_0. In the second read period T1, a voltage level of the third power HV2 is at the target voltage HVt required in the read operation.

Figure 5:
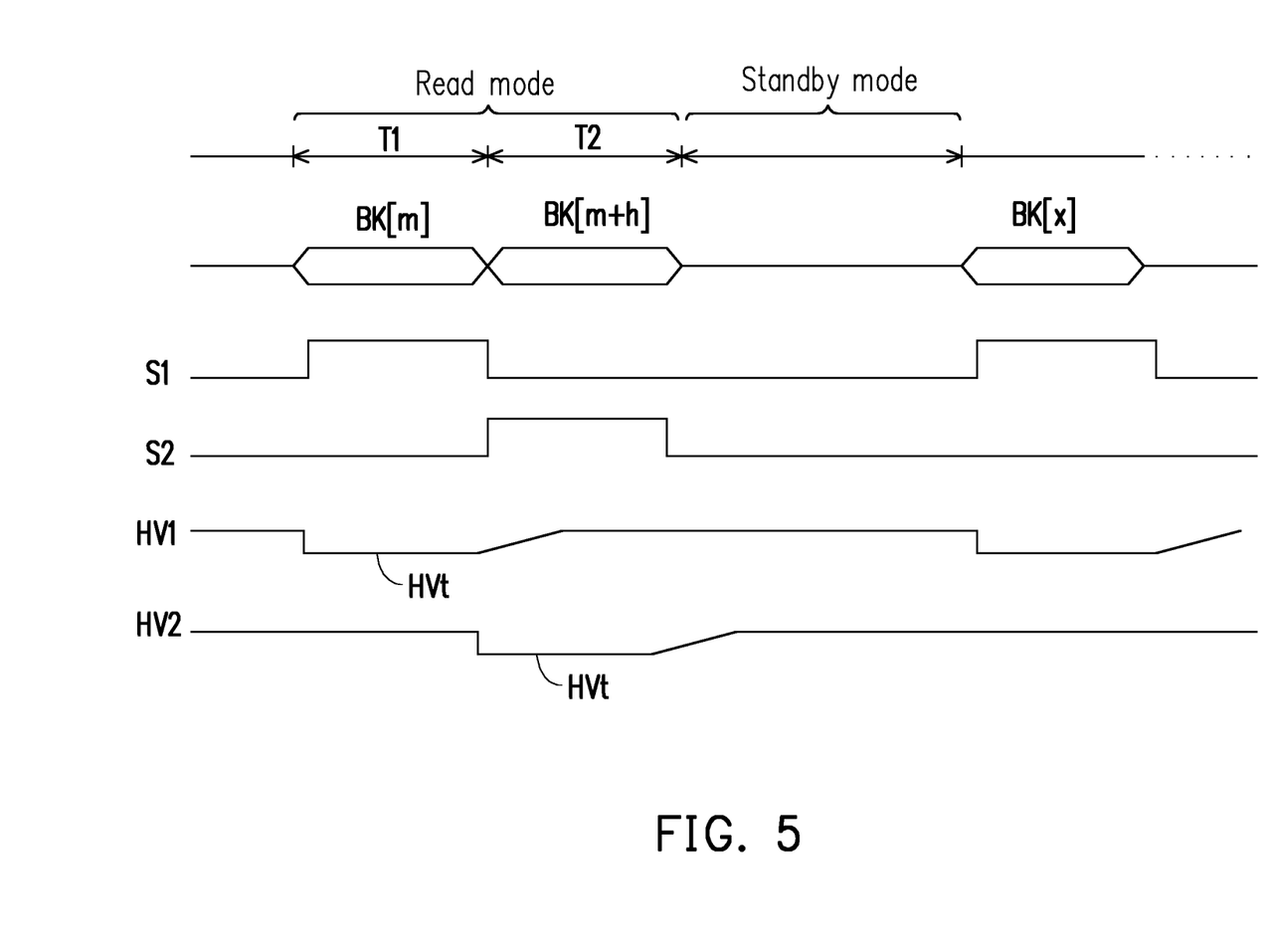
FIG. 5 illustrates a schematic diagram of signal waveforms according to another embodiment of the invention.

FIG. 5 illustrates a schematic diagram of signal waveforms according to another embodiment of the invention. With reference to FIG. 4 and FIG. 5, a read operation of the present embodiment is similar to that in the embodiment of FIG. 4, and a major difference between the two is that different banks in the memory cell array are read in the read mode of the present embodiment. Specifically, in the present embodiment, the memory bank corresponding to the bank address BK[m] is read in the first read period T1, and a memory bank corresponding to a bank address BK[m+h] is read in the second read period T2, wherein h is a positive integer greater than 0. In addition, enough teaching, suggestion, and description regarding detail steps and implementation for an operating method for providing power to the word line decoder 344 by the power supply circuit 320 in the read mode may be obtain from the embodiment of FIG. 4, which is not repeated hereinafter.

Figure 6:
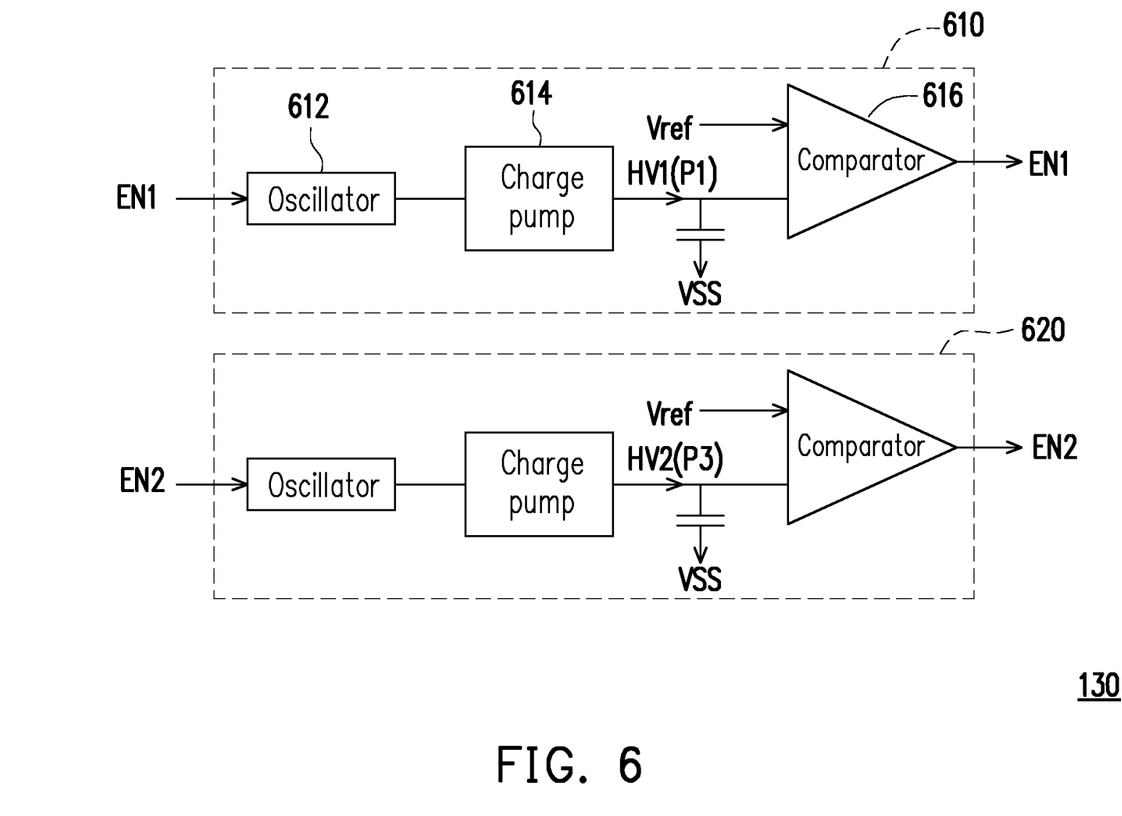
FIG. 6 illustrates a schematic diagram of the voltage generator circuit in the embodiment of FIG. 1.

FIG. 6 illustrates a schematic diagram of the voltage generator circuit in the embodiment of FIG. 1. With reference to FIG. 1, FIG. 3 and FIG. 6, the voltage generator circuit 130 of the present embodiment includes a first charge pump circuit 610 and a second charge pump circuit 620. The first charge pump circuit 610 is configured to provide the first power P1 to the memory cell array 120 and boost a voltage value of the first power P1 when the first power P1 is lower than a reference charge voltage Vref (a first reference voltage). The second charge pump circuit 620 is configured to provide the third power P3 to the memory cell array 120 and boost a voltage value of the third power P3 when the third power P3 is lower than a reference voltage Vref (a second reference voltage). In the present embodiment, the reference voltage Vref received by the first charge pump circuit 610 and the second charge pump circuit 620 may be the same or not the same, and the invention is not limited thereto.

Specifically, in the present embodiment, the first charge pump circuit 610 includes an oscillator 612, a charge pump 614 and a comparator 616. The charge pump 614 is configured to generate the first power HV1 and output the first power HV1 to the word line decoder 320 and the comparator 616. When the voltage value of the first power HV1 is lower than the reference voltage Vref, the comparator 616 outputs an enable signal EN1 as a feedback to the oscillator 612 to enable the oscillator 612 for generating an oscillation signal, which may be used by the charge pump 614 for raising the third power P3 to a preset voltage value. In addition, enough teaching, suggestion, and description regarding detail steps and implementation for an operating method of the second charge pump circuit 620 of the present embodiment may be obtained from the disclosed content for the first charge pump circuit 610, which is not repeated hereinafter.

In the present embodiment, circuit schemes for each the circuit functional block (e.g., the oscillator, the charge pump and the comparator) in the first charge ump circuit 610 and the second charge ump circuit 620 may be implemented by any suitable circuits in related art, which are not particularly limited by the invention. Enough teaching, suggestion, and implementation illustration for aforesaid steps and embodiments thereof may be obtained with reference to common knowledge in the related art, which is not repeated hereinafter.

In the embodiment of FIG. 3, in the standby mode, the power supply circuit 320 provides, for example, the second power having the voltage value VCC-Vt (a second voltage) to the word line decoder 344, but the invention is not limited thereto. In other embodiments, in the standby mode, the power supply circuit provides, for example, the second power having the voltage value VCC (a first voltage) to the word line decoder (referring to FIG. 10), or provide the second power having a voltage value VSS (a third voltage) to the word line decoder (referring to FIG. 7). In other words, in the exemplary embodiments of the invention, the second power is one selected from the first voltage VCC, the second voltage VCC-Vt and the third voltage VSS. The first voltage VCC is greater than the second voltage VCC-Vt, and the second voltage VCC-Vt is greater than the third voltage VSS.

Figure 7:
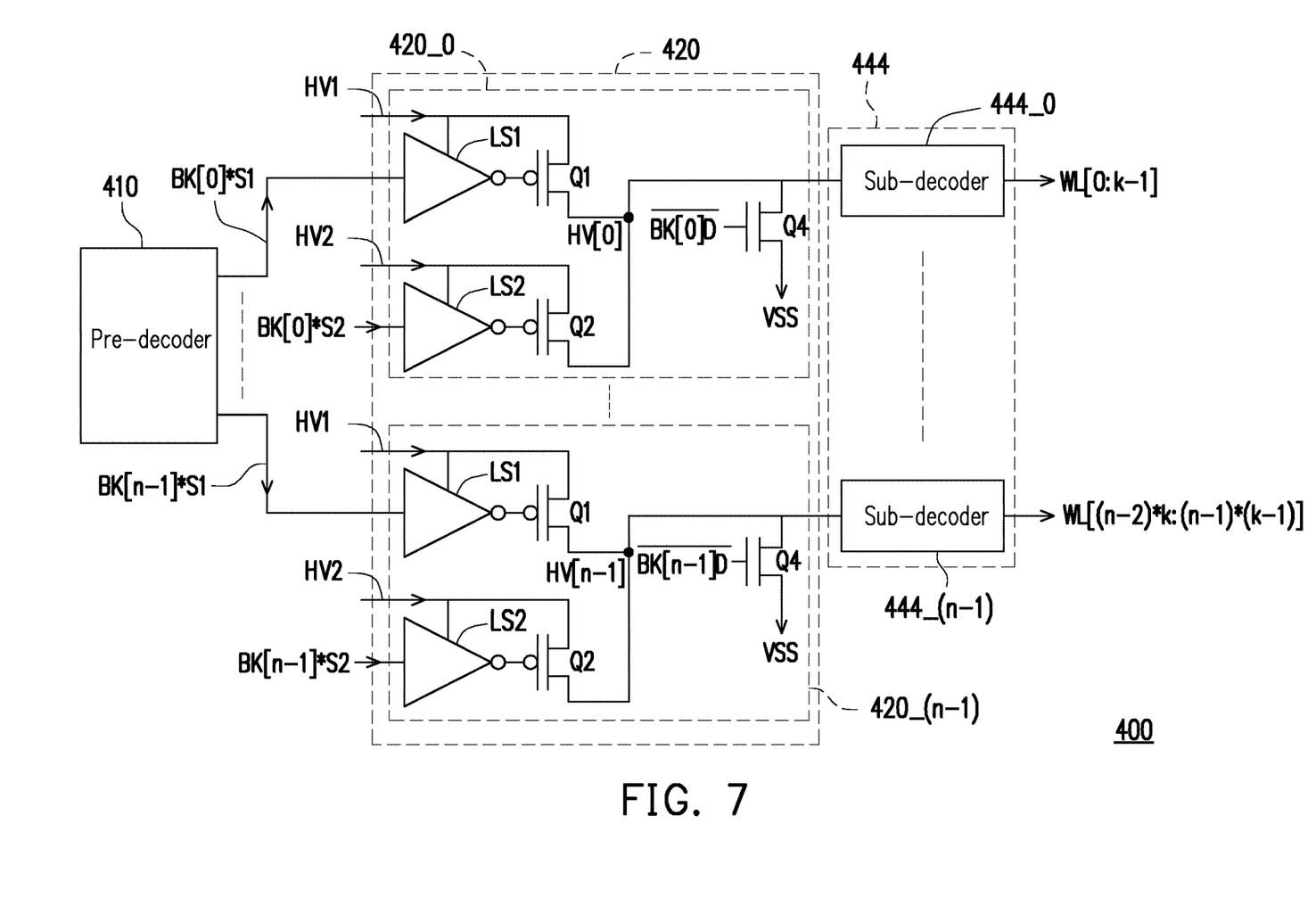
FIG. 7 illustrates a schematic diagram of a word line decoder according to another embodiment of the invention.

FIG. 7 illustrates a schematic diagram of a word line decoder according to another embodiment of the invention. With reference to FIG. 3 and FIG. 7, a word line decoder 400 of the present embodiment is similar to the word line decoder 300 in the embodiment of FIG. 3, and the major difference between the two is that, a power supply circuit 420 provides the second power having the voltage value VSS (the third voltage) to a word line decoder 444.

Specifically, taking a power supply 420_0 as an example, the node HV[0] is coupled to one terminal of a transistor switch Q4. Another terminal of the transistor switch Q4 is coupled to the third voltage VSS, and a control terminal of the transistor switch Q4 is controlled by a control signal $\overline{BK[0]D}$. Among them, the control signal $\overline{BK[0]D}$ represents an inversed signal of the delayed bank BK[0]. In the standby mode, the control signal $\overline{BK[0]D}$ controls the transistor switch Q4 to be turned on, and the control signals BK[0]*S1 and BK[0]*S2 respectively control the transistor switches Q1 and Q2 to be not turned on. Therefore, the third voltage VSS is provided to a sub-decoder 444_0 via the transistor switch Q4. In the present embodiment, in the standby mode, an operating method for providing the third voltage VSS to the corresponding sub-decoder by the other power supplies may refer to description for the power supply 420_0 by analogy, which is not repeated hereinafter. In the present embodiment, the voltage value of the first power HV1 is greater than the voltage value VSS of the second power, and the voltage value of the third power HV2 is greater than the voltage value VSS of the second power.

Figure 8:
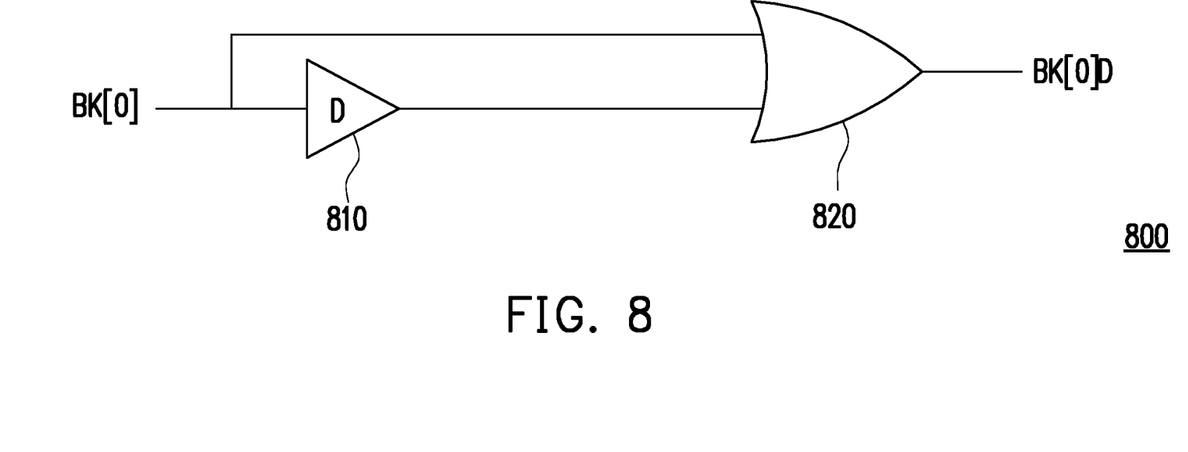
FIG. 8 illustrates a schematic diagram of the control signal generator circuit in the embodiment of FIG. 7.
Figure 9:
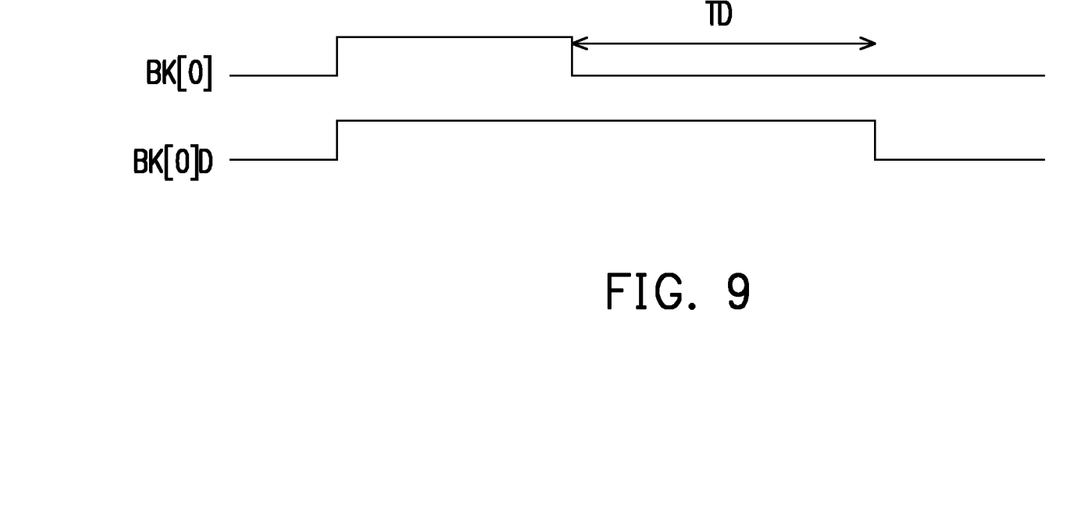
FIG. 9 illustrates a waveform diagram of the control signals in the embodiment of FIG. 8.

FIG. 8 illustrates a schematic diagram of the control signal generator circuit in the embodiment of FIG. 7. FIG. 9 illustrates a waveform diagram of the control signals in the embodiment of FIG. 8. With reference to FIG. 7 to FIG. 9, a control signal generator circuit 800 of the present embodiment includes a delay element 810 and an OR gate 820. The delay element 810 receives the bank address BK[0] and delays it by a delay time TD. Next, the OR gate 820 then generates an output signal BK[0]D according to the bank address BK[0] and the delayed bank address BK[0]. Then, the output signal BK[0]D is outputted to a next stage circuit of the control signal generator circuit 800 for inversion, so as to generate the control signal $\overline{BK[0]D}$. A generating method for the other control signals, such as a control signal $\overline{BK[n-1]D}$, may be deduced from the above, which is not repeated hereinafter. In the exemplary embodiments of the invention, since there are many generating methods for generating the control signal, those illustrated in FIG. 8 and FIG. 9 are merely examples and the invention is not limited thereto.

Figure 10:
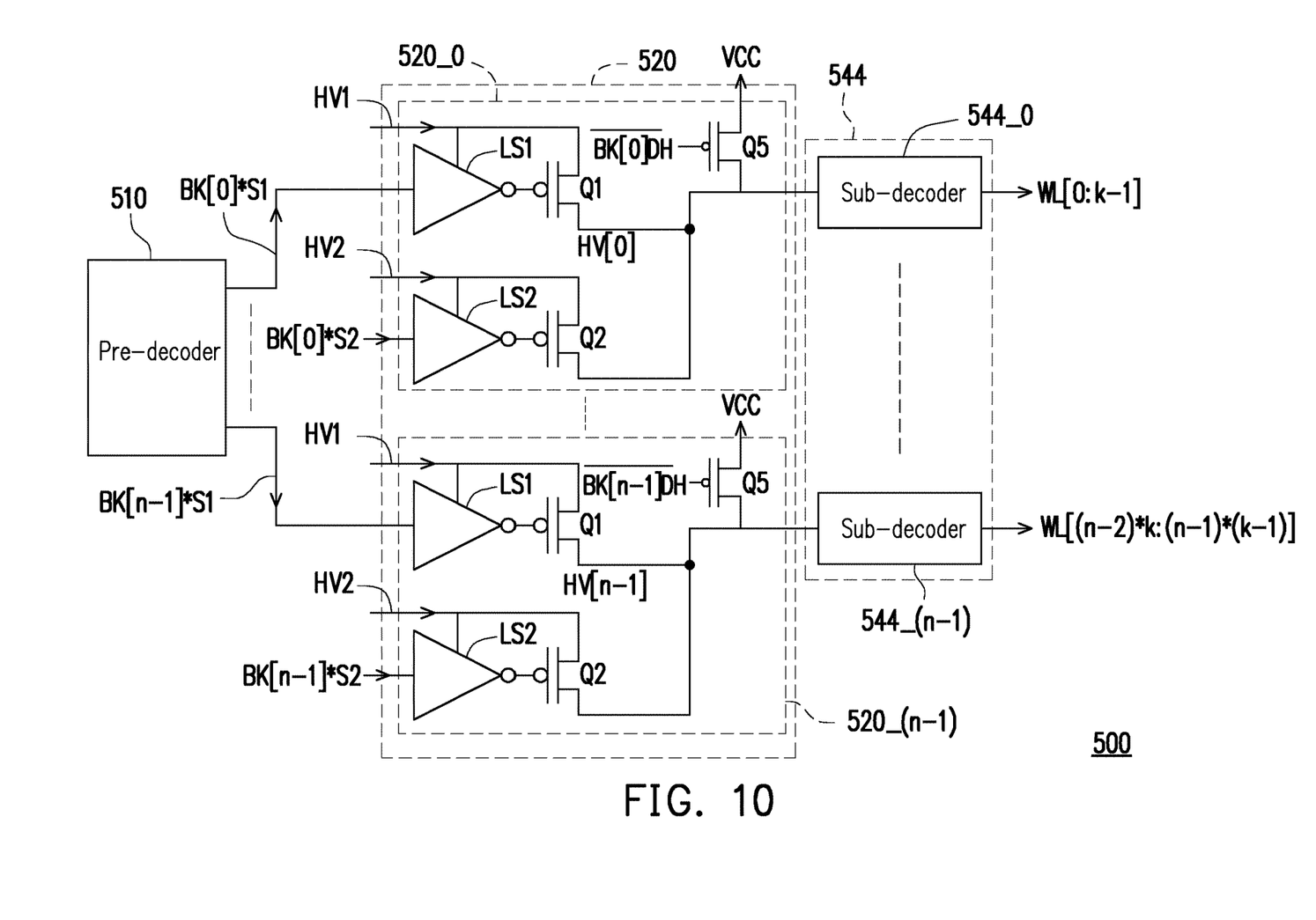
FIG. 10 illustrates a schematic diagram of a word line decoder according to another embodiment of the invention.

FIG. 10 illustrates a schematic diagram of a word line decoder according to another embodiment of the invention. With reference to FIG. 3 and FIG. 10, a word line decoder 500 of the present embodiment is similar to the word line decoder 300 in the embodiment of FIG. 3, and the major difference between the two is that, a power supply circuit 520 provides the second power having the voltage value VCC (the first voltage) to a word line decoder 544.

Specifically, taking a power supply 520_0 as an example, the node HV[0] is coupled to one terminal of a transistor switch Q5. Another terminal of the transistor switch Q5 is coupled to the first voltage VCC, and a control terminal of the transistor switch Q5 is controlled by a control signal $\overline{BK[0]D}_H$. Among them, the control signal $\overline{BK[0]D}_H$ is a delayed inverse signal of the bank address BK[0] having a high level signal. In the standby mode, the control signal $\overline{BK[0]D}_H$ controls the transistor switch Q5 to be turned on, and the control signals BK[0]*S1 and BK[0]*S2 respectively control the transistor switches Q1 and Q2 to be not turned on. Therefore, the first voltage VSS is provided to a sub-decoder 544_0 via the transistor switch Q5. In the present embodiment, in the standby mode, an operating method for providing the first voltage VCC to the corresponding sub-decoder by the other power supplies may refer to description for the power supply 520_0 by analogy, which is not repeated hereinafter. In the present embodiment, the voltage value of the first power HV1 is less than the voltage value VCC of the second power, and the voltage value of the third power HV2 is less than the voltage value VCC of the second power.

To sum up, in the exemplary embodiments of the invention, because the power of the word line decoder is not the high voltage (HV) provided by the charge pump in the standby mode, a sub-threshold current may be reduced to thereby reduce a standby current. The power of the word line decoder in the standby mode is, for example, the first voltage, the second voltage or the third voltage. In the exemplary embodiments of the invention, in the read mode, for example, two powers (i.e., the first power and the third power) are designed. Upon receiving the read command, the two powers can be alternately provided to the word line decoder. In the same read mode, the read banks may be the same bank or different banks in the memory cell array. As a result, in the exemplary embodiments of the invention, the current consumed by the word line decoder in the standby mode may be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A word line decoder circuit, located in a memory storage apparatus comprising a memory cell array, the word line decoder circuit comprising:
    a word line decoder, coupled to a plurality of word lines of the memory storage apparatus; and
    a power supply circuit, coupled to the word line decoder, a first charge pump circuit, and a second charge pump circuit, wherein the power supply circuit comprising a plurality of power supplies, and configured to provide a first power by the first charge pump circuit to the word line decoder in a read mode and provide a second power by means of the plurality of power supplies to the word line decoder in a standby mode,
    wherein a voltage value of the first power is greater than or less than a voltage value of the second power,
    wherein the second charge pump circuit is configured to provide a third power to the word line decoder in a read mode.

2. The word line decoder circuit as recited in claim 1, wherein a voltage value of the third power is greater than or less than the voltage value of the second power.

3. The word line decoder circuit as recited in claim 2, wherein the voltage value of the first power is equal to the voltage value of the third power.

4. The word line decoder circuit as recited in claim 2, wherein the read mode comprises a first read period and a second read period, the word line decoder receives the first power in the first read period, and the word line decoder receives the third power in the second read period.

5. The word line decoder circuit as recited in claim 4, wherein a first bank in the memory cell array is read in the first read period, and a second bank in the memory cell array is read in the second read period.

6. The word line decoder circuit as recited in claim 5, wherein the first bank and the second bank are a same bank in the memory cell array.

7. The word line decoder circuit as recited in claim 5, wherein the first bank and the second bank are different banks in the memory cell array.

8. The word line decoder circuit as recited in claim 2, wherein the word line decoder comprises:
    a plurality of sub-decoders, each of the sub-decoders being coupled to a plurality of corresponding word lines among the word lines.

9. The word line decoder circuit as recited in claim 8, wherein each of the power supplies being coupled to corresponding one of the sub-decoders, wherein each of the power supplies is configured to provide the first power or the third power to the coupled sub-decoder in the read mode, and provide the second power to the coupled sub-decoder in the standby mode.

10. The word line decoder circuit as recited in claim 2, wherein the first charge pump circuit is configured to provide the first power and boost the voltage value of the first power when the first power is lower than a first reference voltage.

11. The word line decoder circuit as recited in claim 10, wherein second charge pump circuit boosts the voltage value of the third power when the third power is lower than a second reference voltage.

12. The word line decoder circuit as recited in claim 1, further comprising:
   a pre-decoder, coupled to the power supply circuit, and configured to select a bank in the memory cell array for a read operation.

13. The word line decoder circuit as recited in claim 1, wherein the second power is one selected from a first voltage, a second voltage and a third voltage.

14. The word line decoder circuit as recited in claim 13, wherein the first voltage is greater than the second voltage, and the second voltage is greater than the third voltage.

\* \* \* \* \*